US010210836B2

(12) United States Patent
Park et al.

(10) Patent No.: US 10,210,836 B2
(45) Date of Patent: Feb. 19, 2019

(54) GATE DRIVER AND DISPLAY DEVICE USING THE SAME

(71) Applicant: LG DISPLAY CO., LTD., Seoul (KR)

(72) Inventors: Yongseok Park, Goyang-si (KR); Hyelim Ji, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/799,516

(22) Filed: Oct. 31, 2017

(65) Prior Publication Data

US 2018/0122323 A1 May 3, 2018

(30) Foreign Application Priority Data

Oct. 31, 2016 (KR) .................. 10-2016-0144009

(51) Int. Cl.
*G09G 3/36* (2006.01)
*H01L 27/12* (2006.01)
(Continued)

(52) U.S. Cl.
CPC ......... *G09G 3/3677* (2013.01); *G09G 3/3688* (2013.01); *H01L 27/124* (2013.01); *H01L 27/1225* (2013.01); *H01L 27/1248* (2013.01); *H01L 27/1255* (2013.01); *H01L 29/42384* (2013.01); *H01L 29/7869* (2013.01); *H01L 29/78696* (2013.01); *G02F 1/1368* (2013.01); (Continued)

(58) Field of Classification Search
CPC ............... G09G 3/3677; G09G 3/3688; G09G 2310/0251; G09G 2310/0289; G09G 2310/08; G09G 2320/043; G09G 2300/0426; G09G 2310/0286; H01L 29/7869; H01L 27/1225; H01L 27/124; H01L 27/1248; H01L 27/1255; H01L 29/42384; H01L 29/78696; G02F 1/13338; G02F 1/136286; G02F 1/1368; G02F 2202/104; G02F 1/133512; G02F 1/133514

See application file for complete search history.

(56) References Cited

U.S. PATENT DOCUMENTS

2007/0040771 A1* 2/2007 Chung .................. G11C 19/00
345/76
2007/0263763 A1* 11/2007 Moon ................... G11C 19/00
377/68

(Continued)

FOREIGN PATENT DOCUMENTS

KR 10-2008-0033773 A 4/2008

*Primary Examiner* — Abhishek Sarma
(74) *Attorney, Agent, or Firm* — Seed IP Law Group LLP

(57) ABSTRACT

A gate driver and a display device using the same are disclosed. The gate driver includes a first transistor configured to pre-charge a Q node, a second transistor configured to raise the output voltage depending on a voltage of the Q node, a third transistor configured to charge a QB node, a fourth transistor configured to lower the output voltage depending on a voltage of the QB node, and a capacitor connected between a gate and a source in at least one of the second transistor and the third transistor. The capacitor has a capacitance greater than a capacitance between the gate and a drain of the transistor to which the capacitor is connected. The capacitor includes an upper capacitor disposed on an organic passivation layer covering the transistors.

20 Claims, 17 Drawing Sheets

(51) Int. Cl.
  *H01L 29/423*  (2006.01)
  *H01L 29/786*  (2006.01)
  *G02F 1/1333*  (2006.01)
  *G02F 1/1335*  (2006.01)
  *G02F 1/1362*  (2006.01)
  *G02F 1/1368*  (2006.01)

(52) U.S. Cl.
  CPC .... *G02F 1/13338* (2013.01); *G02F 1/133512* (2013.01); *G02F 1/133514* (2013.01); *G02F 1/136286* (2013.01); *G02F 2202/104* (2013.01); *G09G 2300/0426* (2013.01); *G09G 2310/0251* (2013.01); *G09G 2310/0286* (2013.01); *G09G 2310/0289* (2013.01); *G09G 2310/08* (2013.01); *G09G 2320/043* (2013.01)

(56)  References Cited

U.S. PATENT DOCUMENTS

2018/0061868 A1* 3/2018 Na .................... H01L 27/1251
2018/0122298 A1* 5/2018 Lee .................... G09G 3/3233

* cited by examiner

Dual Length          Single Length

GATE DRIVER AND DISPLAY DEVICE USING THE SAME

CROSS-REFERENCE TO RELATED APPLICATIONS

This application claims the priority benefit of Korean Patent Application No. 10-2016-0144009 filed on Oct. 31, 2016, the entire contents of which is incorporated herein by reference in its entirety for all purposes as if fully set forth herein.

BACKGROUND

Technical Field

The present disclosure relates to a gate driver and a display device using the same.

Description of the Related Art

A display device includes a data driver for supplying a data signal to data lines of a pixel array, a gate driver (or a scan driver) for sequentially supplying a gate pulse (or a scan pulse) synchronized with the data signal to gate lines (or scan lines) of the pixel array, a timing controller for controlling the data driver and the gate driver, and the like.

Each of pixels may include a thin film transistor (hereinafter, referred to as TFT) which supplies a voltage of a data line to a pixel electrode in response to the gate pulse. The gate pulse swings between a gate-on voltage (VGH) and a gate-off voltage (VGL). The gate-on voltage VGH is set to a voltage higher than a threshold voltage of the TFT, and the gate-off voltage VGH is set to a voltage lower than a threshold voltage of the TFT.

Recently, a technique of embedding the gate driver in a display panel together with the pixel array has been applied. Hereinafter, the gate driver embedded in the display panel will be referred to as a gate in panel (GIP) circuit. The GIP circuit includes a shift register. The shift register includes a plurality of stages connected in a cascade connection to shift an output voltage in accordance with a shift clock timing.

The gate pulse sequentially selects pixels to be charged with a data voltage line by line in synchronization with the data voltage of an input image, that is, a pixel voltage. A stage of the shift register receives a start pulse or a carry signal received from a previous stage as a start pulse, and generates an output when a clock is input.

As shown in FIGS. 1 and 2, each of the stages includes a pull-up transistor Tu that charges an output terminal in response to a Q node voltage to raise an output voltage Vout (n), a pull-down transistor Td that discharges the output terminal in response to a QB node voltage to lower the output voltage, and a switch circuit 10 for charging and discharging a Q node and a QB node. The output terminal of each of the stages is connected to a gate line of the display panel.

When the Q node is pre-charged by a gate-on voltage VGH and a shift clock CLK is input to a drain, the pull-up transistor Tu charges the output terminal up to the gate-on voltage VGH of the shift clock CLK. When the shift clock CLK is input to the drain of the pull-up transistor Tu, the Q node voltage floated through a capacitance between the drain and a gate of the pull-up transistor Tu is raised by 2VGH by bootstrapping. At this time, the pull-up transistor Tu is turned on by the 2VGH voltage of the Q node and a voltage of the output terminal rises to the VGH. When the QB node voltage is charged by the VGH, the pull-down transistor Td supplies a gate-off voltage VGL to the output terminal to discharge the output voltage Vout (n) to VGL.

The switch circuit 10 charges the Q node in response to a start pulse input through a VST terminal or a carry signal received from a previous stage and discharges the Q node in response to a signal received through an RST terminal or a VNEXT terminal. A reset signal for simultaneously discharging the Q node of all the stages S (N−1), S (N), and S (N+1) is applied to the RST terminal. A carry signal generated from a next stage is applied to the VNEXT terminal. The switch circuit 10 can charge and discharge the QB node as opposed to the Q node by using an inverter.

The GIP circuit is formed on the same substrate together with the pixel array in the display panel and disposed in a bezel area. Therefore, the GIP circuit is a limiting factor when the bezel area of the display device is narrowly designed. When elements are added in order to increase reliability of the GIP circuit, the bezel area of the display device is widened due to an increase in an area of the GIP circuit.

A TFT including amorphous silicon (a-Si) (hereinafter, referred to as "a-Si TFT") can restore a threshold voltage shift by applying an AC voltage. For this reason, the GIP circuit implemented with the a-Si TFT was able to restore a threshold voltage shift of the pull-down transistor by driving the QB node with an AC voltage.

BRIEF SUMMARY

The disclosure provides a gate driver capable of removing a ripple of a GIP circuit and reducing a GIP circuit area, and a display device using the same.

In one aspect, there is provided a gate driver including a plurality of stages to which a shift clock is applied through a clock wiring and which are connected in a cascade connection manner through a carry signal and sequentially generate an output voltage through each output terminal.

Each of the stages includes a first transistor configured to pre-charge a Q node, a second transistor configured to raise the output voltage depending on a voltage of the Q node, a third transistor configured to charge a QB node, a fourth transistor configured to lower the output voltage depending on a voltage of the QB node, and a first capacitor connected between a gate and a source in at least one of the second transistor and the third transistor. The first capacitor has a capacitance greater than a capacitance between the gate and a drain of the transistor to which the first capacitor is connected. The first capacitor includes an upper capacitor disposed on an organic passivation layer covering the transistors.

The upper capacitor may include a first electrode and a second electrode opposite to each other with an inorganic passivation layer interposed therebetween.

The first capacitor may further include a lower capacitor disposed under the organic passivation layer and overlapped with the upper capacitor.

The lower capacitor may include a third electrode and a fourth electrode overlapped with each other with a gate insulating layer interposed therebetween.

The gate driver may further include a fifth transistor connected between a gate and a drain of the first transistor.

The fifth transistor may include a gate connected to the gate of the first transistor, a drain to which a gate-on voltage is applied, and a source connected to the drain of the first transistor. A carry signal may be applied to the gates of the first and fifth transistors.

The gate driver may further include a second capacitor connected between the gate and the source of the fifth transistor. The second capacitor may have a capacitance greater than a capacitance between the gate and the drain of the fifth transistor. The second capacitor may include the upper capacitor disposed on the organic passivation layer.

The upper capacitor may include a first electrode and a second electrode opposite to each other with an inorganic passivation layer interposed therebetween.

The second capacitor may further include a lower capacitor disposed under the organic passivation layer and overlapped with the upper capacitor. The lower capacitor may include a third electrode and a fourth electrode overlapped with each other with a gate insulating layer interposed therebetween.

In each of the capacitors, a thickness of the inorganic passivation layer may be less than that of the gate insulating layer.

Each of the first and fifth transistors may have a semiconductor channel of a single length structure.

In another aspect, there is provided a display device including a display panel in which data lines and gate lines intersect, pixels are arranged in a matrix form and a display driver configured to write data of an input image to the pixels. The display driver includes a shift register configured to sequentially supply a gate pulse to the gate lines.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings:

FIG. 12 is a diagram illustrating a difference in size of a GIP circuit between an asymmetrical capacitor shown in FIG. 10 and an asymmetrical capacitor shown in FIG. 11a;

DETAILED DESCRIPTION

Figure 1:
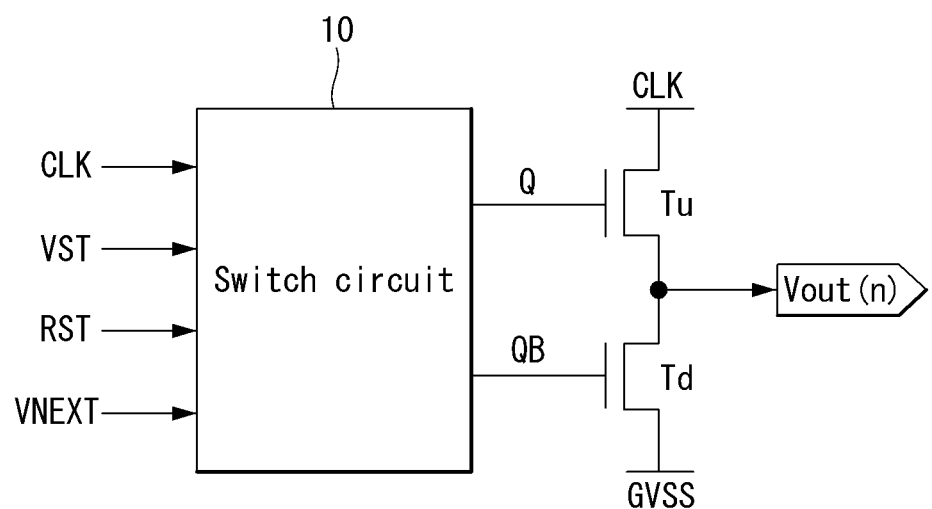
FIG. 1 schematically illustrates one stage for outputting a gate pulse in a shift register of a gate driver.
Figure 2:
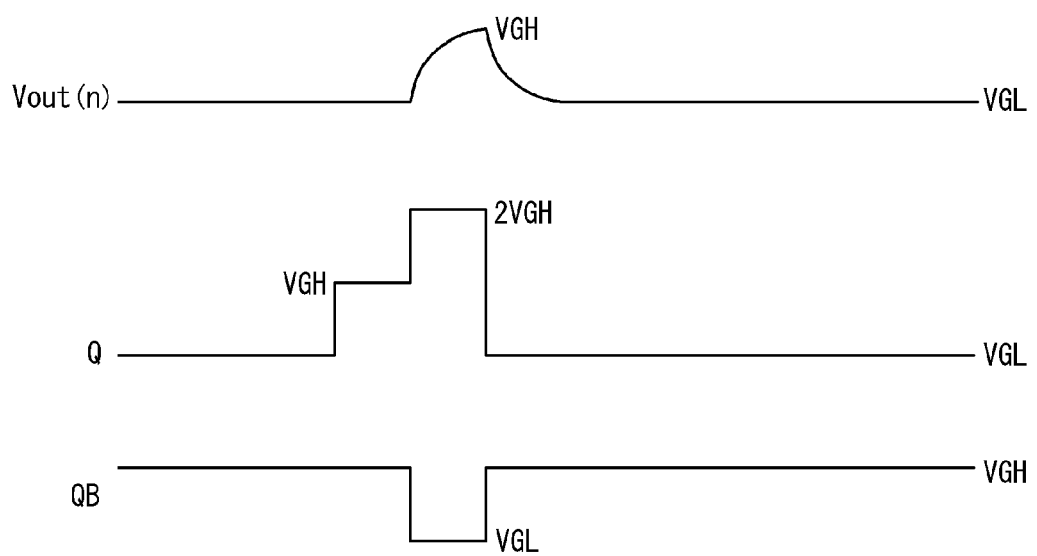
FIG. 2 is a waveform diagram illustrating operation of a stage shown in FIG. 1.

Advantages and features of the present disclosure and methods for accomplishing the same will become apparent with reference to embodiments described in detail below with reference to the accompanying drawings. However, the present disclosure is not limited to the embodiments disclosed below, and may be implemented in various forms. These embodiments are provided so that the present disclosure will be exhaustively and completely described, and will fully convey the scope of the present disclosure to those skilled in the art to which the present disclosure pertains. The present disclosure is defined by the scope of the claims.

Shapes, sizes, ratios, angles, number, and the like illustrated in the drawings for describing embodiments of the present disclosure are merely exemplary, and the present disclosure is not limited thereto. Like reference numerals designate like elements throughout the description. In the following description, when a detailed description of well-known functions or configurations related to this document is determined to unnecessarily cloud a gist of the disclosure, the detailed description thereof will be omitted. In the present disclosure, when the terms "include," "have," "comprised of" etc. are used, other components may be added unless "~ only" is used. A singular expression can include a plural expression as long as it does not have an apparently different meaning in context.

In the explanation of components, even if there is no separate description, it is interpreted as including an error range.

In the description of position relationship, when a structure is described as being positioned "on" or "above," "under" or "below," "next to" another structure, this description should be construed as including a case in which the structures contact each other as well as a case in which a third structure is disposed therebetween.

In the following description of the embodiment, the terms "first," "second," etc. may be used to describe various components, but the components are not limited by such terms. These terms are only used to distinguish one component from another component. Therefore, the first component mentioned below may be the second component within the technical spirit of the disclosure.

The features of various embodiments of the present disclosure can be partially combined or entirely combined with each other, and is technically capable of various interlocking and driving. The embodiments can be independently implemented, or can be implemented in conjunction with each other.

Hereinafter, preferred embodiments of the disclosure will be described in detail with reference to the accompanying drawings. Like reference numerals designate like elements throughout the description. In the following description, when a detailed description of well-known functions or configurations related to this document is determined to unnecessarily cloud a gist of the disclosure, the detailed description thereof will be omitted.

Recently, due to demand of the display device, a study on applying a TFT including an oxide semiconductor (hereinafter, referred to as an "oxide TFT") to switch elements of a pixel and a GIP circuit of a high resolution model is being studied. The oxide TFT is advantageous for realizing high performance of the display device, but it is difficult to compensate for degradation of the characteristics. In an instance of the oxide TFT, when the threshold voltage is shifted due to the DC gate bias stress and its characteristics are degraded, even when a voltage of the opposite polarity is applied to the gate, there is almost no recovery of the threshold voltage. According to an experimental result of applying the oxide TFT to the pull-down transistor of the GIP circuit, since the degradation of the oxide TFT is not recovered even though the QB node is driven by the AC voltage, the threshold voltage shift of the pull-down transistor becomes severe with time. As a result, the voltage of the gate line is not discharged, and a ripple other than a normal output occurs when the shift clock occurs. Switch elements can be added to the GIP circuit to prevent such a ripple. However, this increases the area of the GIP circuit and makes it difficult to implement a narrow bezel.

A display device according to an embodiment of the disclosure may be implemented as a flat panel display device such as a liquid crystal display (LCD), an OLED display, or the like. In the following embodiments, the liquid crystal display is described as an example of the flat panel display device, but the disclosure is not limited thereto. For example, the disclosure is applicable to any display device including those that include an in-cell touch sensor.

A gate driver according to an embodiment of the disclosure may be implemented as a thin film transistor (TFT) of an n-type or p-type metal oxide semiconductor field effect transistor (MOSFET) structure. Although an n-type TFT is illustrated as an example in the following descriptions, it should be noted that the embodiments of the disclosure are not limited to this. The TFT is a three-electrode element including a gate, a source, and a drain. The source is an electrode that supplies carriers to the transistor. In the TFT, the carriers start to flow from the source. The drain is an electrode in which the carriers exit from the TFT to the outside. That is, the carriers in the MOSFET flow from the source to the drain. In an instance of the n-type MOSFET (NMOS), since the carriers are electrons, a source voltage is lower than a drain voltage so that the electrons can flow from the source to the drain. In the n-type MOSFET, a current flows from the drain to the source because the electrons flow from the source to the drain. In an instance of the p-type MOSFET (PMOS), since the carriers are holes, the source voltage is higher than the drain voltage so that the holes can flow from the source to the drain. In the p-type MOSFET, the current flows from the source to the drain because the holes flow from the source to the drain. It should be noted that the source and drain of the MOSFET are not fixed. For example, the source and the drain of the MOSFET may be changed depending on an applied voltage. In the following description of the embodiment, the source and the drain of the transistor will be referred to as first and second electrodes. It should be noted that the disclosure is not limited by the source and drain of the transistor in the following description.

The TFTs constituting the gate driver according to an embodiment of the disclosure may be implemented as one or more TFTs among a TFT (oxide TFT) including an oxide semiconductor, a TFT including amorphous silicon (a-Si), and a TFT (LTPS TFT) including low temperature polysilicon (LTPS).

Figure 3:
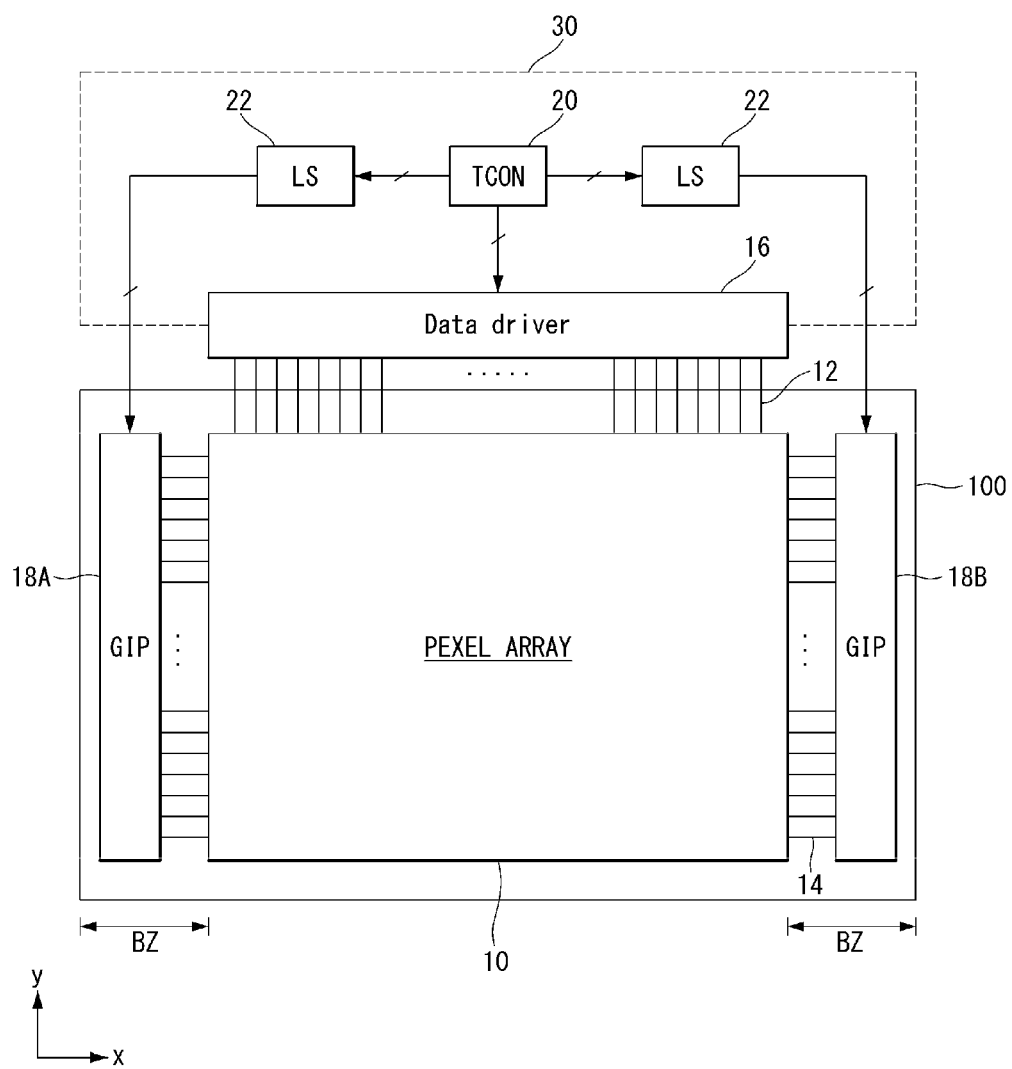
FIG. 3 is a block diagram schematically illustrating a display device according to an embodiment of the disclosure.
Figure 4:
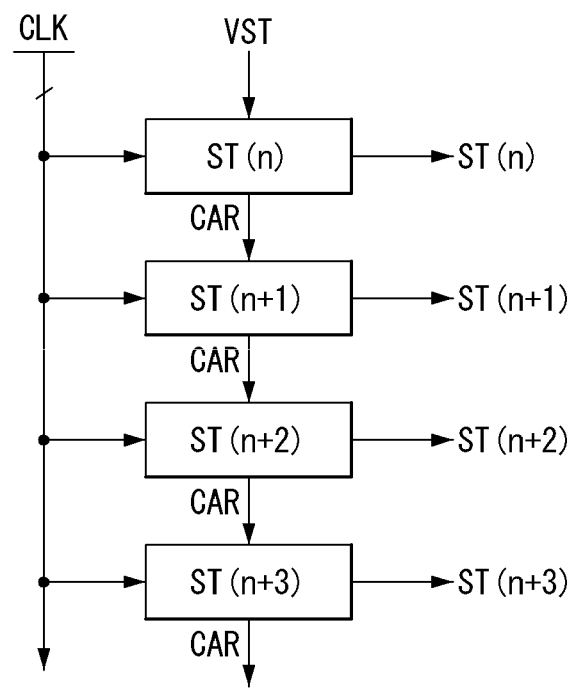
FIG. 4 is a diagram illustrating stages that are connected in a cascade connection manner in a GIP circuit.

Referring to FIGS. 3 and 4, a display device according to an embodiment of the disclosure includes a display panel 100, a display driver for writing data of an input image into pixels of a pixel array 10 of the display panel 100.

The display panel 100 includes data lines 12, gate lines 14 intersected with the data lines 12, and a pixel array 10 in which pixels are arranged in a matrix form defined by the data lines 12 and the gate lines 14. The pixel array 10 implements a screen on which the input image is displayed.

The pixels of the pixel array 10 may include red (R), green (G), and blue (B) sub-pixels for color implementation. Each of the pixels may further include white (W) sub-pixel in addition to the RGB sub-pixels.

The pixel array 10 of the display panel 100 may be divided into a TFT array and a color filter array. The TFT array may be formed on a lower substrate of the display panel 100. The TFT array includes thin film transistors (TFTs) formed at intersections of the data lines 12 and the gate lines 14, a pixel electrode for charging a data voltage, a storage capacitor Cst connected to the pixel electrode to maintain the data voltage, and the like, and displays the input image. An in-cell touch sensor may be disposed on the TFT array. In this instance, the display device further includes a sensor driving unit for driving the in-cell touch sensor.

The color filter array may be formed on an upper substrate or the lower substrate of the display panel 100. The color filter array includes a black matrix, a color filter, and the like. In an instance of a color filter on TFT (COT) or a TFT on color filter (TOC) model, the color filter and the black matrix may be arranged on one substrate together with the TFT array.

The display driver includes a data driver 16 and gate drivers 18A, 18B, and 22 to write the data of the input image to the pixels of the display panel 100.

The data driver 16 includes one or more source driver ICs. The source driver IC may be mounted on a chip on film (COF) and connected between the display panel 100 and a printed circuit board (PCB). The source driver IC may be directly bonded on a substrate of the display panel 100 by a chip on glass (COG) process.

The data driver 16 converts digital video data of the input image received from a timing controller (TCON) 20 into a gamma compensation voltage to output a data voltage. The data voltage output from the data driver 16 is supplied to the data lines 12. A multiplexer (not shown) may be disposed between the data driver 16 and the data lines 12. The multiplexer distributes the data voltage received from the data driver 16 to the data lines 12 under a control of the timing controller 20. In an instance of a 1:3 multiplexer, the multiplexer time-divides the data voltage input through one output channel of the data driver 16 and supplies the data voltage to two data lines in a time division manner. By using the 1:3 multiplexer, the number of channels of the data driver 16 can be reduced to ⅓.

The gate drivers 18A, 18B and 22 include a level shifter (LS) 22 and a GIP circuit 18A and 18B. The level shifter 22 is disposed between the timing controller 20 and the GIP circuit 18A and 18B. The GIP circuit 18A and 18B may be formed directly on the lower substrate of the display panel 100 together with the TFT array.

The GIP circuit 18A and 18B includes a shift register. The GIP circuit 18A and 18B may be formed in a bezel BZ at one side edge of the display panel 100 outside the pixel array or in a bezel BZ at both side edges. The level shifter 22 shifts a swing width of a gate timing control signal received from the timing controller 20 to a gate-on voltage and a gate-off voltage and outputs the gate timing control signal having a swing width between the gate-on voltage and the gate-off voltage to the GIP circuit 18A and 18B. In the NMOS, the gate-on voltage is a gate-on voltage (VGH) higher than a threshold voltage of the NMOS and the gate-off voltage is a gate-off voltage (VGL) lower than the threshold voltage of the NMOS. In the PMOS, the gate-on voltage is the gate-off voltage (VGL) and the gate-off voltage is the gate-on voltage (VGH). Hereinafter, transistors of the GIP circuit 18A and 18B will be described with reference to the NMOS, but the disclosure is not limited thereto.

Each of the GIP circuit 18A and 18B shifts a gate pulse in accordance with a shift clock CLK to sequentially supply the gate pulse to the gate lines 14. The shift clock CLK may be a 2-phase clock to 8-phase clock, but the shift clock CLK is not limited thereto.

The gate pulse output from the GIP circuit 18A and 18B swings between VGH and VGL. VGH is the gate-on voltage higher than the TFT threshold voltage of the pixel. VGL is lower than VGH and is the gate-off voltage lower than the TFT threshold voltage of the pixel. The TFTs of the pixels are turned on in response to VGH of the gate pulse to supply the data voltage from the data lines 12 to the pixel electrode.

The GIP circuit 18A and 18B may be disposed to the left or right of the pixel array 10 and is disposed on the left and right sides of the display panel 100. Left and right GIP circuits 18A and 18B are synchronized by the timing controller 20. The left GIP circuit 18A may be connected to odd-numbered gate lines 14 of the pixel array 10 to sequentially supply the gate pulse to the odd-numbered gate lines 14. The right GIP circuit 18B 104 may be connected to even-numbered gate lines 14 of the pixel array 10 to sequentially supply the gate pulse to the even-numbered gate lines 14. The left GIP circuit 18A and the right GIP circuit 18B may be connected to all the gate lines to simultaneously supply the gate pulse to the same gate line.

Figure 5:
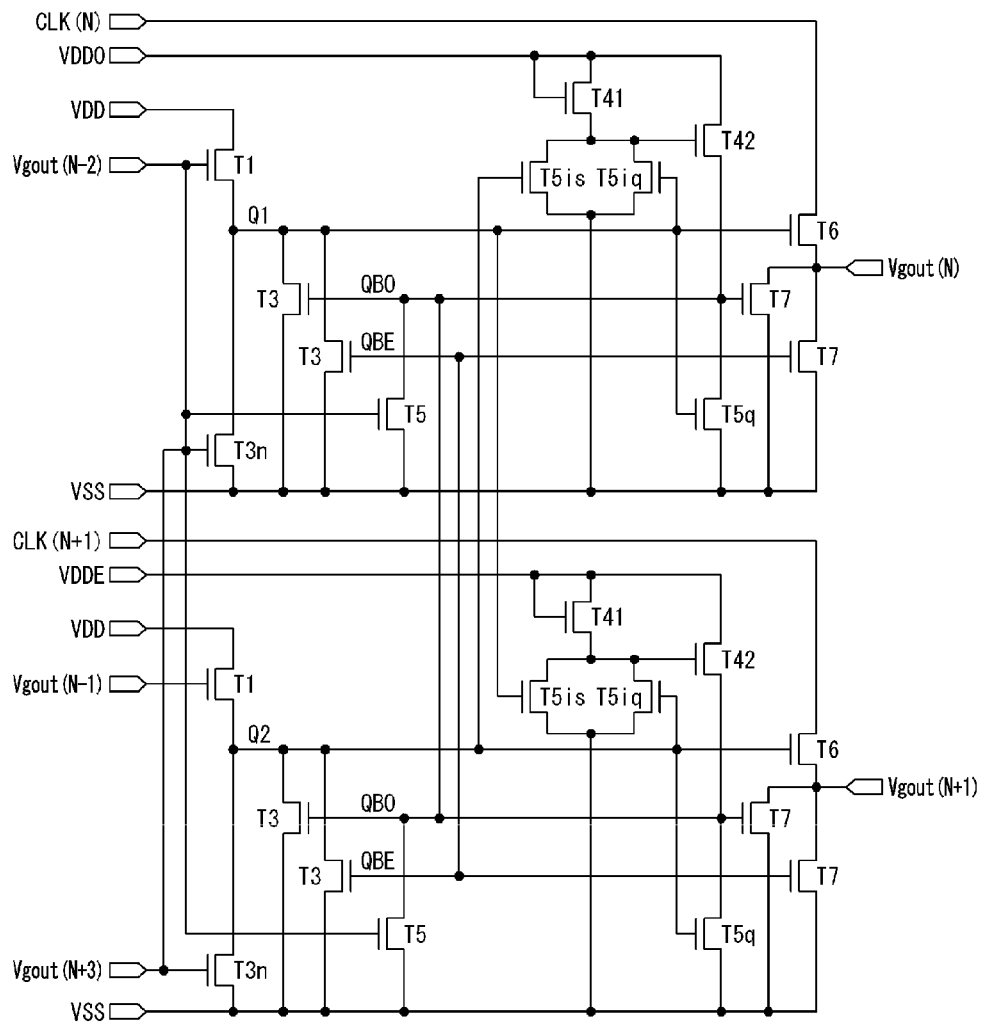
FIGS. 5 and 6 are circuit diagrams illustrating examples of a GIP circuit.

The shift register of the GIP circuit 18A and 18B is connected through a carry signal line through which a carry signal CAR is transmitted in a cascade connection manner as shown in FIG. 4, and includes stages ST(n) to ST(n+3) for shifting the gate pulse in synchronization with the shift clock CLK timing. Each of the stages ST(n) to ST(n+3) sequentially supplies the gate pulse to the gate lines 14 and transmits the carry signal CAR to another stage. The gate pulse and the carry signal may be the same signal output through one output terminal in each stage or may be separated through two output terminals in each stage. The stage to which the carry signal CAR is transmitted is not limited to a specific stage. For example, as shown in FIG. 5, an nth (n is a positive integer) stage may receive a carry signal output from an (n−2)th stage, but it is not limited thereto.

The timing controller 20 transmits the digital video data of the input image received from a host system (not shown) to the data driver 16. The timing controller 20 receives timing signals such as a vertical synchronization signal Vsync, a horizontal synchronization signal Hsync, a data enable signal DE, and a main clock MCLK, which are received in synchronization with the data of the input image, and outputs a data timing control signal for controlling operation timing of the data driver 16, and a gate timing control signal for controlling operation timing of the level shifter 22 and the GIP circuit 18A and 18B. The timing controller 20 and the level shifter 22 may be mounted on the PCB 30.

The gate timing control signal includes a start pulse VST, a gate shift clock (GCLK), a gate output enable signal (GOE), and the like. The gate output enable signal (GOE) may be omitted. The start pulse VST is input to a VST terminal in a first stage of the GIP circuit 18A and 18B to control output timing of a first gate pulse that occurs first in one frame period. The gate shift clock (GCLK) controls output timing of the gate pulse in each of the stages of the GIP circuit 18A and 18B to control shift timing of the gate pulse.

The host system may be implemented as any one of a television system, a set-top box, a navigation system, a DVD player, a Blu-ray player, a personal computer (PC), a home theater system, and a phone system. The host system converts the digital video data of the input image into a format suitable for display on the display panel 100. The host system transmits the timing signals (Vsync, Hsync, DE, MCLK) to the timing controller 20 together with the digital video data of the input image. The host system executes an application program associated with coordinate information of a touch input received from a touch sensing unit.

Figure 6:
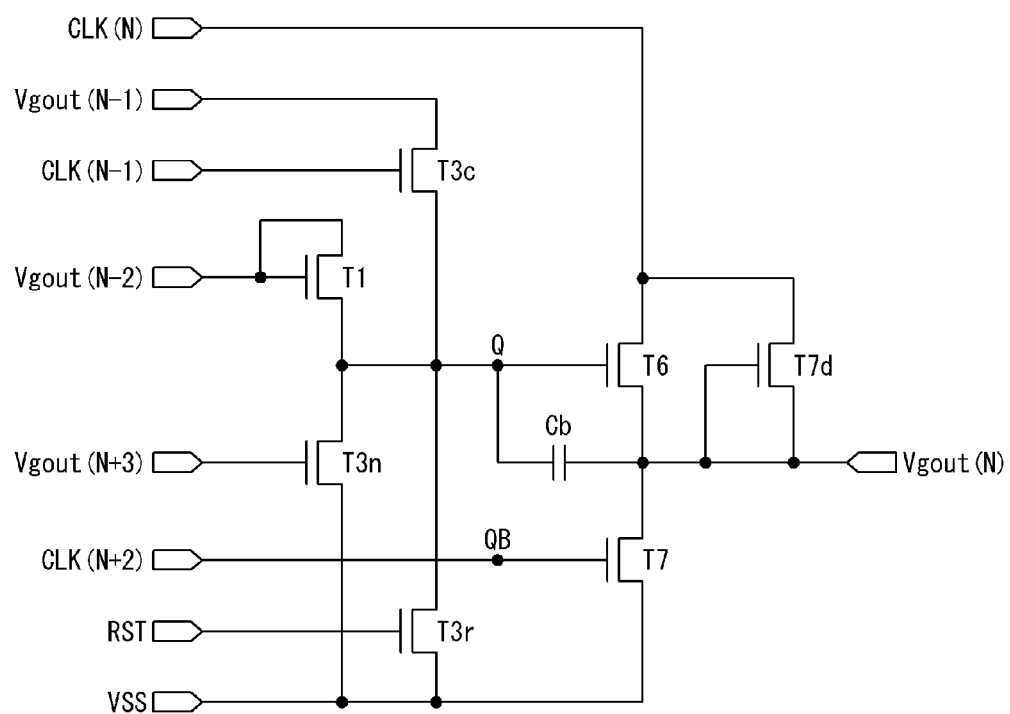

The GIP circuit 18A and 18B of the disclosure reduces a ripple by connecting an asymmetric capacitor to at least one transistor. The disclosure is applicable to any GIP circuit. FIGS. 5 and 6 illustrate a GIP circuit to which the disclosure is applicable. However, it should be noted that the disclosure is not limited thereto.

FIGS. 5 and 6 are circuit diagrams illustrating examples of a GIP circuit.

FIG. 5 illustrates two neighboring stages in the GIP circuit 18A and 18B.

Referring to FIG. 5, in order to reduce DC gate bias stress of pull-down transistors T7, a QB node may be divided into QBO and QBE and the QB nodes (QBO, QBE) may be charged and discharged alternately for a predetermined time.

In order to reduce an area of the GIP circuit in a high-resolution display device, the QB nodes (QBO, QBE) and a VNEXT terminal may be shared in neighboring Nth and (N+1)th stages. The QBO nodes of the Nth and (N+1)th stages are connected to each other, and the QBE nodes of the Nth and (N+1)th stages are connected to each other. The VNEXT terminal to which a carry signal Vgout (N+3) from a next stage is applied is commonly connected in the Nth and (N+1)th stages.

Each of the Nth and (N+1)th stages raises an output voltages Vgout (N) and Vgout (N+1) through a pull-up transistor T6 and lowers the output voltages Vgout (N) and Vgout (N+1) through the pull-down transistors T7. The Nth output voltage Vgout (N) output from the Nth stage is applied to an Nth gate line 14 as a gate pulse and also to a VST terminal of an (N+2)th stage as a carry signal. The (N+1)th output voltage Vgout (N+1) output from the (N+1)th stage is applied to an (N+1)th gate line 14 as a gate pulse, and to a VST terminal of an (N+3)th stage and a VNEXT terminal of an (N−1)th stage as a carry signal.

Each of the Nth and (N+1)th stages includes the pull-up transistor T6 connected to a Q node (Q1, Q2), the pull-down transistors T7 connected to the QB nodes (QBO, QBE), switch circuits T1, T3, T3*n*, T41, T42, T5*is*, T5*iq*, T5*q* and T5 for charging or discharging the Q node (Q1, Q2) and the QB nodes (QBO, QBE). When a carry signal Vgout (N−2) and Vgout (N−1) from a previous stage is inputted to a VST terminal, a transistor T1 is turned on. A gate-on voltage VGH from a VDD terminal is applied to the Q node (Q1, Q2), and the Q node (Q1, Q2) is pre-charged. A transistor T3*n* discharges the Q node (Q1, Q2) in response to the carry signal Vgout (N+3) of the next stage received through the VNEXT terminal. The transistors T41, T42, T5*is*, T5*iq* and T5*q* constitute an inverter for charging the QB nodes (QBO, QBE) with an AC voltage (VDDO, VDDE) depending on a Q node voltage and for discharging the QB nodes (QBO, QBE) by connecting the QB nodes (QBO, QBE) to a VSS terminal. A gate-off voltage VGL is applied to the VSS terminal.

The transistors T41, T42, T5*is*, T5*iq*, and T5*q* disposed in the Nth stage supply the VDDO to the QBO node and charge the QBO node of the Nth stage when the Q node Q1 are discharged. The transistors T41, T42, T5*is*, T5*iq*, and T5*q* disposed in the (N+1)th stage supply the VDDE to the QBO node and charge the QBO node of the (N+1)th stage when the Q node Q2 are discharged.

The GIP circuit shown in FIG. 5 does not separate the carry signals, but is not limited thereto. For example, a circuit in which a carry signal Vcout(n) is outputted through a separate output terminal can be added to a GIP circuit shown in FIG. 9. A pull-up transistor T6C and a pull-down transistor T7C for outputting the carry signal Vcout(n) may be added to the Nth and (N+1)th stages, respectively.

Figure 9:
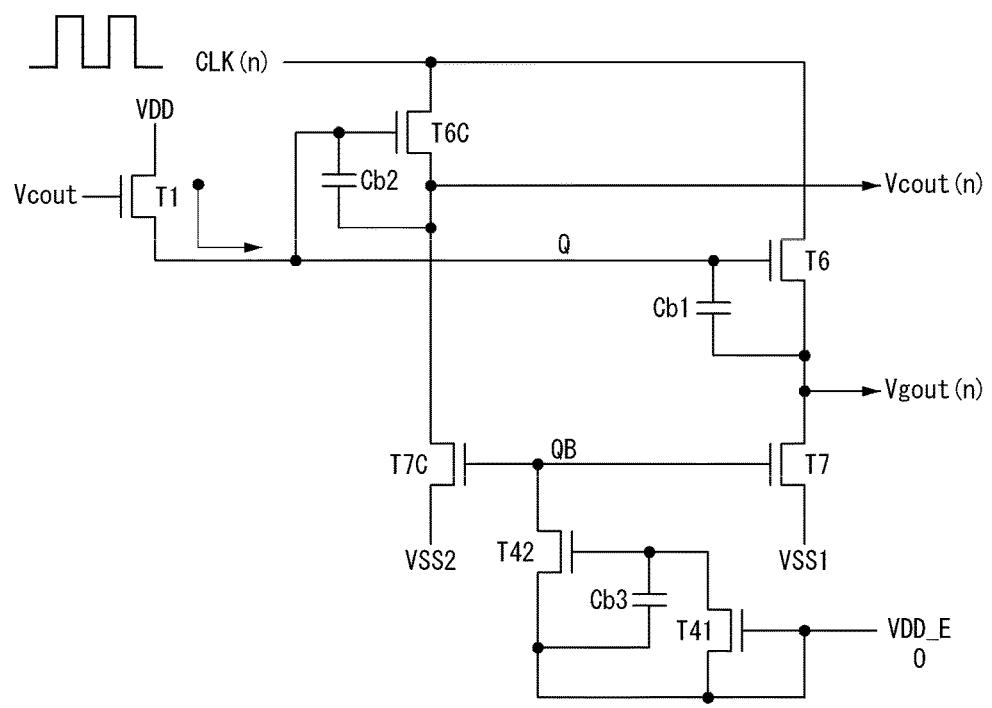
FIG. 9 is a circuit diagram illustrating transistors to which an asymmetric capacitor is connected.

In the GIP circuit shown in FIG. 5, the VSS terminal can be divided into VSS1 terminal and VSS2 terminal as shown in FIG. 9. The VSS2 terminal may be connected to transistors for switching a discharge path of the Q node, the QB node, and the carry signal Vcout(n). The VSS1 terminal may be connected to transistors for switching a discharge path of the gate pulse Vgout(n). VGL (−10V) applied to the VSS2 terminal is set to a voltage lower than VGL (−5V) applied to the VSS1 terminal, so that degradation of the pull-up transistor and a voltage (ΔVp) of pixels can be reduced, and a rising edge and a falling edge of the gate pulse can be reduced.

FIG. 6 illustrates an Nth stage for generating an Nth output voltage Vgout (N) in the GIP circuit 18A and 18B.

Referring to FIG. 6, each of stages of the GIP circuit 18A and 18B includes a pull-up transistor T6 connected to a Q node Q, a pull-down transistor T7 connected to a QB node QB that is connected to a clock signal CLK (N+2), namely an (N+2)th shift clock, switch circuits T1, T3*n*, T3*c* and T3*r* for charging or discharging the Q node Q and the QB node QB, a diode T7*d* connected between an output terminal and a clock wiring, and the like.

The GIP circuit 18A and 18B further include a capacitor Cb connected between the Q node and the output terminal to reduce a ripple of the output voltage Vgout (N).

When a carry signal Vgout (N−2) from an (N−2)th stage is input, the transistor T1 operates as a diode and applies a gate-on voltage VGH of the carry signal Vgout (N−2) to the Q node to pre-charge the Q node. When a carry signal Vgout (N−1) from an (N−1)th stage is input, the transistor T3*c* applies a gate-on voltage VGH of the carry signal Vgout (N−1) to the Q node to charge the Q node. The transistor T3*n* discharges the Q node in response to a carry signal Vgout (N+3) from an (N+3)th stage. The transistor T3*r* is turned on in response to a reset signal received through an RST terminal to discharge the Q node.

When the output voltage is higher than a voltage of the clock wiring by more than a threshold voltage Vth, the diode T7*d* is turned on to discharge a voltage of the output terminal to the clock wiring. On the other hand, when a gate-on voltage VGH of an Nth shift clock CLK (N) is input to a first electrode (drain) of the pull-up transistor T6 through the clock wiring, a normal output voltage Vgout (N) is generated. At this time, since the voltages of the clock wiring and the output terminal are both VGH, Vds of the diode T7*d* becomes 0 and the diode T7*d* maintains an OFF state. Therefore, the output voltage Vgout (N) is not discharged through the diode T7*d*.

The capacitor Cb is connected between a gate of the pull-up transistor T6 and a second electrode (source) to reduce the ripple voltage of the output voltage Vgout (N). The function and effect of the capacitor Cb will be described later with reference to FIG. 8A.

The diode T7*d* and the capacitor Cb may be applied to the GIP circuit shown in FIG. 5 to remove the ripple from the output voltage Vgout.

Figure 7:
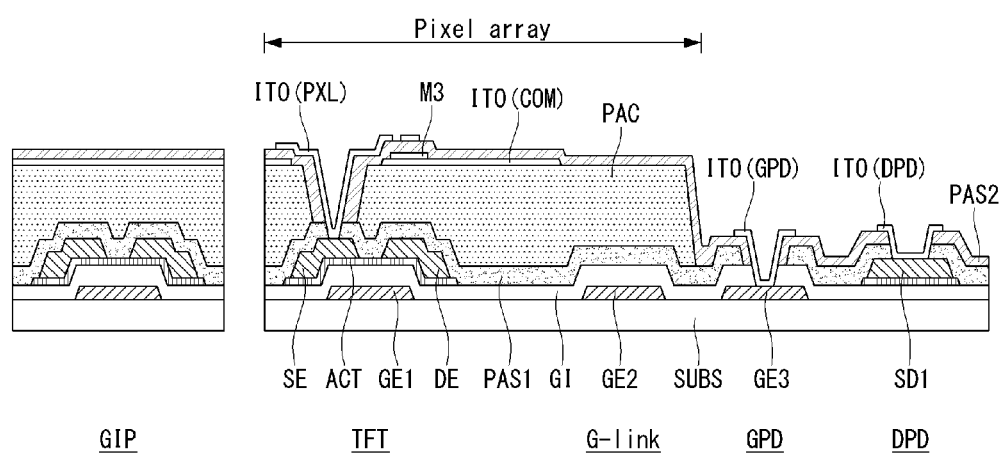
FIG. 7 is a cross-sectional view illustrating a cross-sectional structure of a TFT array substrate of a display panel.

FIG. 7 is a cross-sectional view illustrating a cross-sectional structure of a TFT array substrate of a display panel 100. FIG. 7 illustrates a part of a TFT array of the display panel 100 related to the disclosure. "GIP" represents one transistor in the GIP circuit 18A and 18B.

Referring to FIG. 7, the TFT array substrate is formed with a first metal pattern on a substrate SUBS. The first metal pattern includes a gate GE1 of a TFT formed in a pixel array 10, a gate line 14 connected to the gate GE1 of the TFT, a gate metal pattern GE2 of a gate link (G-link), a lower metal pattern GE3 of a gate pad GPD, and a gate metal pattern of a GIP circuit area GIP. A gate insulating layer GI is formed on the substrate SUBS so as to cover the first metal pattern. A semiconductor pattern ACT is formed on the gate insulating layer GI.

A second metal pattern is formed on the semiconductor pattern ACT. The second metal pattern includes a source SE and a drain DE of the TFT formed in the pixel array 10 and the GIP circuit area GIP, a data line 12 connected to the drain DE of the TFT, a lower metal pattern of a data pad DPD, and the like. A first inorganic passivation layer PAS1 is formed on the pixel array 10, the gate pad GPD, the data pad DPD and the GIP circuit area GIP to cover the second metal pattern. An organic passivation layer pattern PAC is formed on the first inorganic passivation layer PAS1. The organic passivation layer pattern PAC covers the TFTs of the pixel array 10 and the GIP circuit 18A and 18B, and is not formed on the gate pad GPD and the data pad DPD. A common electrode ITO (COM) is formed on the organic passivation layer pattern PAC and a third metal pattern M3 is formed on the common electrode ITO (COM). The common electrode ITO (COM) and a pixel electrode ITO (PXL) are formed of a transparent electrode material such as indium-tin oxide (ITO). The third metal pattern M3 is formed of a metal having a low resistance to compensate for the high resistivity of ITO and is formed on the common electrode ITO (COM).

A second inorganic passivation layer PAS2 is formed on the pixel array 10, the GIP circuit area GIP, the gate pad GPD, and the data pad DPD so as to cover the common electrode ITO (COM) and the third metal pattern M3. The second inorganic passivation layer PAS2 covers the common electrode ITO (COM), the third metal pattern M3, and the organic passivation layer pattern PAC on the pixel array 10 and the GIP circuit area GIP, and covers the first inorganic passivation layer PAS1 on the gate pad GPD and the data pad DPD. The TFTs of the pixel array 10 are connected to the pixel electrode ITO (PXL). To this end, a contact hole is formed in the organic passivation layer pattern PAC and the second inorganic passivation layer PAS2 to expose the source SE of the TFT.

A transparent electrode pattern is formed on the second inorganic passivation layer PAS2. The transparent electrode pattern includes the pixel electrode ITO (PXL) of the pixel array 10, an upper electrode pattern ITO (GPD) of the gate pad GPD, an upper electrode pattern ITO (DPD) of the data pad DPD, and the like.

The data pad DPD is connected to the data line 12 through a data link (not shown). An output terminal of a data driver 16 is connected to the data pad DPD. The gate pad GDP is connected to the gate line 14 through the gate link G-link. Output terminals of the GIP circuit 18A and 18B may be connected directly to the gate line 14.

Figure 8A:
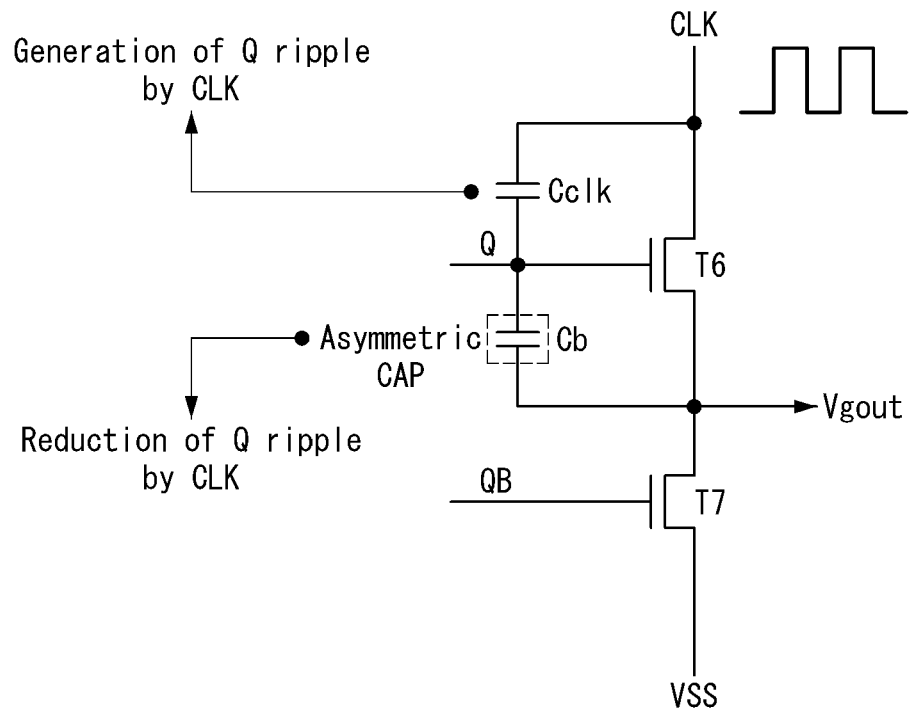
FIG. 8A is a diagram illustrating a ripple reducing effect of an asymmetric capacitor.
Figure 8B:
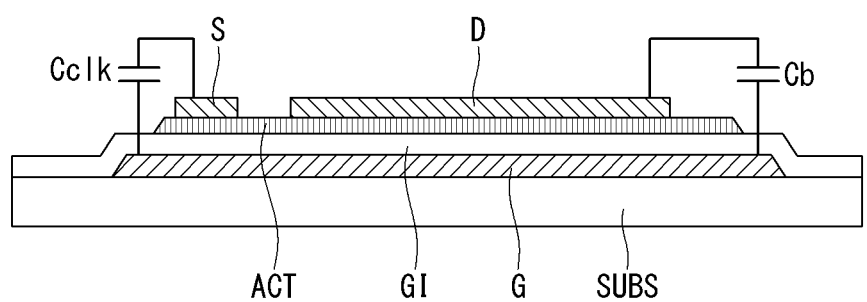
FIG. 8B is a diagram illustrating a cross-sectional structure of the pull-up transistor.

FIG. 8A is a diagram illustrating a ripple reducing effect of an asymmetric capacitor Cb. FIG. 8B is a diagram illustrating a cross-sectional structure of the pull-up transistor.

Referring to FIGS. 8A and 8B, a gate of a pull-up transistor T6 is connected to a Q node of a GIP circuit 18A and 18B. An asymmetric capacitor Cb is connected between the Q node and the output terminal, that is, between the gate and a source of the pull-up transistor T6. A capacitor Cclk is present between a drain and the gate of the pull-up transistor T6. The capacitor Cclk may be a gate-drain parasitic capacitance of the pull-up transistor T6.

In the pull-up transistor T6, the size of electrode of the asymmetrical capacitor Cb is larger than the that of the capacitor Cclk. Therefore, the pull-up transistor T6 has an asymmetric structure in the electrode structure of the source S and the drain D. On the other hand, the other transistors except the pull-up transistor T6 have a structure in which the source and the drain are symmetrical.

In this circuit, a ripple of the Q node is given by the following equation. In the equation below, "Cextra" is a parasitic capacitance other than Cclk. A ripple may be generated in a voltage of the Q node every time a shift clock CLK is generated. This ripple can be reduced by the asymmetric capacitor Cb.

$$Q_{ripple} = \frac{C_{clk}}{C_{clk} + C_b + C_{extra}}$$

When a capacitance of the asymmetric capacitor Cb is small, the voltage of the Q node and a drain-source current of the pull-up transistor T6 are increased and a ripple of an output voltage Vgout is increased. On the other hand, when the capacitance of the asymmetric capacitor Cb is large, the voltage of the Q node and the drain-source current of the pull-up transistor T6 are reduced and the ripple of the output voltage Vgout is reduced. In the above equation, the Q ripple is reduced by making Cb lager than Clk. When the asymmetrical capacitor Cb is connected to the pull-up transistor T6, a voltage margin that a multi-output including the ripple is not generated in the output voltage Vout can be increased. Simulation results show that increasing the Cclk: Cb ratio from 1:1 to 1:2 to 1:6 results in an increase in the multi-output margin as the Cb is increased. Further, in FIGS. 5 and 6, as a ratio of the asymmetric capacitor Cb to a threshold voltage of the transistors T6 and T7 increases, the Q node ripple decreases.

However, when the capacitance of the asymmetric capacitor Cb is increased, the GIP circuit becomes larger, which makes it difficult to design a narrow bezel.

As shown in FIG. 9, asymmetric capacitors Cb1, Cb2 and Cb3 may be connected not only to pull-up transistors T6 and T6C in the GIP circuit but also to a transistor T42 for charging a QB node in order to reduce the ripple. The asymmetric capacitors Cb1, Cb2 and Cb3 are connected between a gate and a source of these transistors T6, T6C, and T42 and have a capacitance larger than a capacitance between the gate and a drain. In this instance, the GIP circuit cannot but become larger. Further, an asymmetrical capacitor Cb may be connected between a gate and a source of a transistor T1C shown in FIG. 13.

Figure 10:
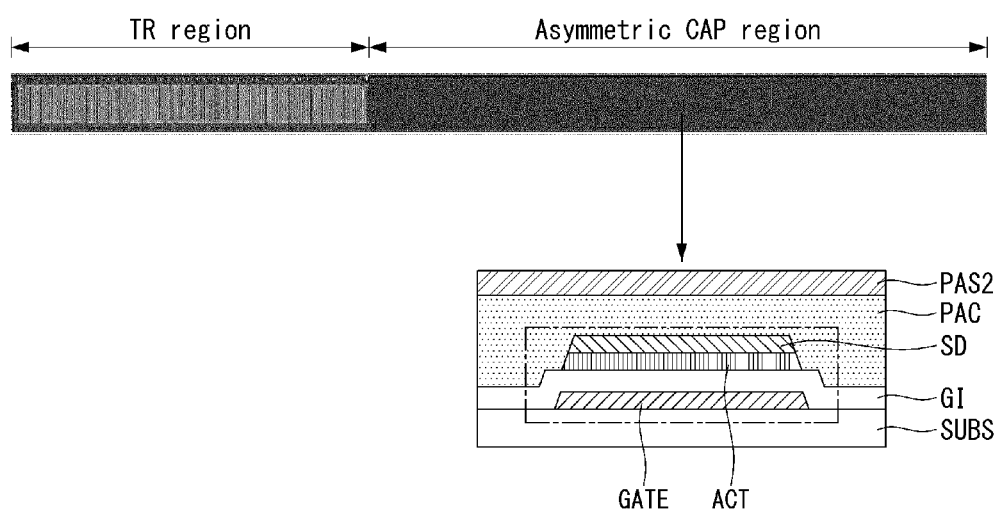
FIG. 10 is a diagram illustrating an example in the related art which a GIP circuit becomes large due to an asymmetric capacitor.
Figure 11A:
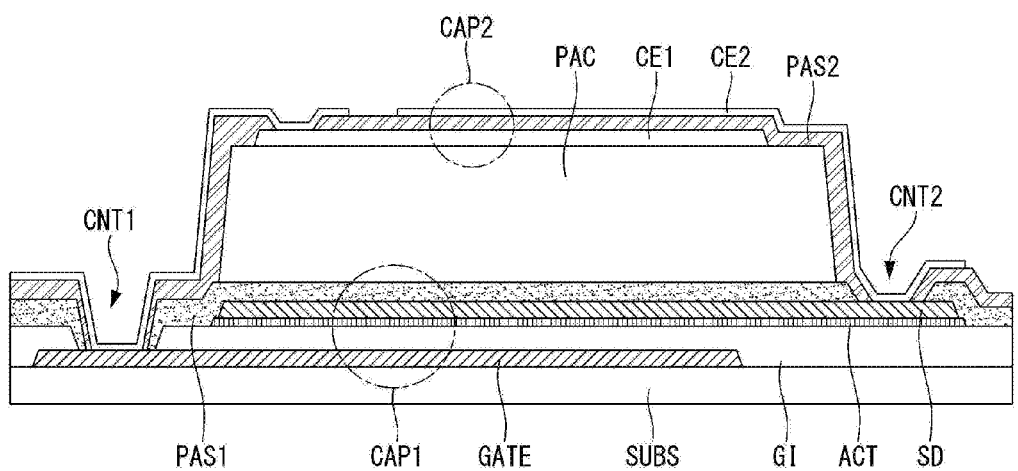
FIG. 11A is a cross-sectional structure of an asymmetric capacitor according to an embodiment of the disclosure.
Figure 11B:
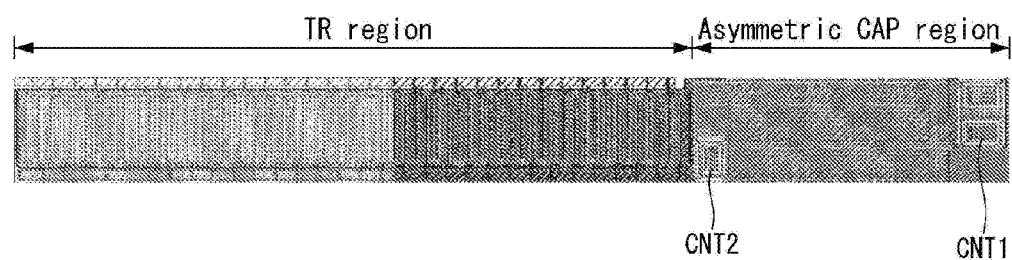
FIG. 11B illustrates a GIP circuit whose size is reduced due to the asymmetric capacitor.
Figure 12:
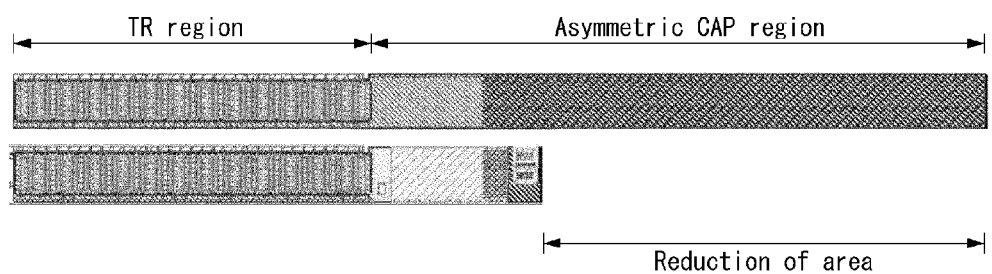

FIG. 10 is a diagram illustrating an example in which a GIP circuit becomes large due to an asymmetric capacitor which occurs in the related art. FIG. 11a is a cross-sectional structure of an asymmetric capacitor according to an embodiment of the disclosure. FIG. 11b illustrates a plan view of the integrated GIP circuit whose size is reduced due to the asymmetric capacitor design of FIG. 11a. FIG. 12 is a diagram illustrating a difference in size of a GIP circuit between an asymmetrical capacitor shown in FIG. 10 and an asymmetrical capacitor shown in FIG. 11a.

An asymmetric capacitor Cb may be formed according to the related art in the cross-sectional structure shown in FIG. 10. The asymmetric capacitor Cb may be formed of a first metal pattern GATE, a second metal pattern SD, and a gate insulating layer GI and a semiconductor pattern ACT formed therebetween. In order to increase a capacitance of the asymmetric capacitor Cb, an electrode area of the asymmetric capacitor Cb must be increased. In FIG. 10, an upper diagram is a plan view illustrating a region (TR region) where transistors are arranged in the GIP circuit 18A and 18B and a region (asymmetric CAP region) where the asymmetric capacitor Cb is disposed. In FIG. 10, a lower diagram that is pointed to by the arrow from the plan view of FIG. 10 is a cross-sectional view illustrating an example of a cross-sectional structure of the asymmetrical capacitor Cb of FIG. 10.

In order to increase the capacitance of the asymmetrical capacitor Cb and reduce the circuit area, the disclosure fabricates the asymmetric capacitor Cb with the structure as shown in FIG. 11a.

Referring to FIG. 11a, the asymmetric capacitor Cb includes a first capacitor CAP1 and a second capacitor CAP2 stacked thereon. The first capacitor CAP1 and the second capacitor CAP2 overlap each other with an organic passivation layer pattern PAC therebetween.

The first capacitor CAP1 includes a first metal pattern GATE and a second metal pattern SD opposite to each other with a gate insulating layer GI and a semiconductor pattern ACT interposed therebetween. The gate insulating layer GI is formed to have a thickness of 5000 Å by stacking $SiO_2$=1900 Å and SiNx=3100 Å. A first inorganic passivation layer PAS1 and the organic passivation layer pattern PAC may be disposed on the first capacitor CAP1 and the second capacitor CAP2 may be disposed on the organic passivation layer pattern PAC. The PAC has a much greater thickness than the GI, for example, it is more than five (5) times thicker in some embodiments, and more than ten (10) times thicker in other embodiments. This reduces the capacitive coupling between the SD layer and the CE1 layer.

The second capacitor CAP2 includes a first electrode pattern CE1 and a second electrode pattern CE2 opposite to each other with a second inorganic passivation layer PAS2 interposed therebetween. The first electrode pattern CE1 may be a transparent electrode formed simultaneously with the common electrode ITO (COM) in FIG. 7. The second electrode pattern CE2 may be a transparent electrode formed simultaneously with the pixel electrode ITO (PXL) in FIG. 7. The second inorganic passivation layer PAS2 may be formed to have a thickness of 1800 Å by stacking $SiO_2$=100 Å and SiNx=1700 Å.

A capacitance Cap of a capacitor is expressed by the following equation.

$$Cap = \varepsilon\varepsilon_0 \frac{d}{l}$$

Where ε is a dielectric constant, ε0 is a dielectric constant in vacuum, d is an electrode area, and I is a thickness of the dielectric.

Viewing FIG. 11b, the smaller footprint in area used size in product itself can be seen. FIG. 11b shows parts of the transistor region, TR as a plan view. Next to it is the asymmetric capacitor. Contacts CNT1 and CNT2 can be seen at each end of the CAP region.

In an example, since the thickness of the second inorganic passivation layer PAS2 is thinner than the gate insulating layer GI, a capacitance of the second capacitor CAP2 is about 2.7 times larger than that of the first capacitor CAP1. Therefore, in the embodiment of the disclosure, the asymmetric capacitor Cb is formed of a dual capacitor formed by combining the first capacitor CAP1 and the second capacitor CAP2 to increase the capacitance Cab of the asymmetrical capacitor Cb, so that the embodiment of the disclosure can prevent the ripple and reduce the GIP circuit area as shown in FIG. 12.

Figure 13:
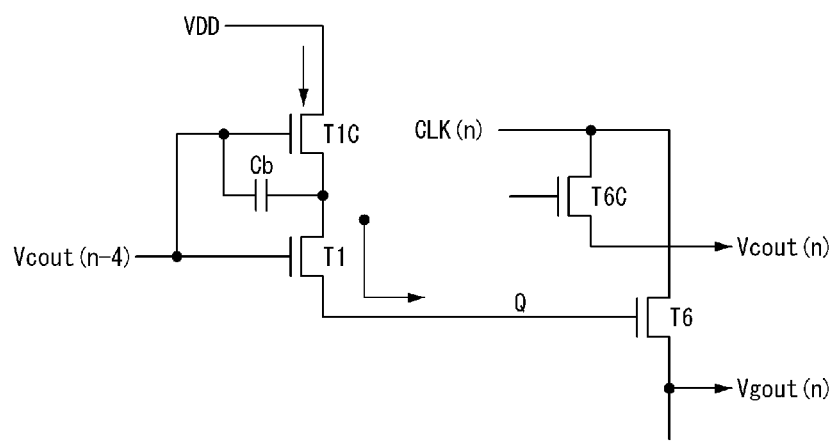
FIG. 13 is a circuit diagram illustrating a method for reducing stress of a Q node pre-charging transistor.

The asymmetric capacitor Cb is connected to the gates and sources of the transistors T1C, T6C, T6 and T42 shown in FIGS. 9 and 13 through a first contact hole CNT1 and a second contact hole CNT2. The first contact hole CNT1 exposes the first metal pattern GATE through the second inorganic passivation layer PAS2, the first inorganic passivation layer PAS1 and the gate insulating layer GI. The first electrode pattern CE1 of the second capacitor CAP2 is brought into contact with the first metal pattern GATE of the first capacitor CAP1 exposed in the first contact hole CNT1 through a transparent electrode pattern. The second contact hole CNT2 exposes the second metal pattern SD through the second inorganic passivation layer PAS2. The second electrode pattern CE2 of the second capacitor CAP2 is brought into contact with the second metal pattern SD of the first capacitor CAP1 exposed in the second contact hole CNT2.

On the other hand, the asymmetric capacitor Cb can be implemented by only the second capacitor CAP2 because the capacitance of the second capacitor CAP2 disposed on the organic passivation layer pattern PAC is sufficiently large.

In FIG. 5, the VDD terminal is connected to the first electrode (drain) of the first transistor T1. A gate-on voltage (VGH), which is a direct current (DC) voltage, is applied to the VDD terminal. As a result, since the first transistor T1 is subjected to direct current stress in the drain for most of one frame period (16.7 ms) except for a very short time during which the carry signal is applied, degradation proceeds quickly and an on current (Ion) is lowered. When a direct current voltage is applied to a drain of an oxide TFT in an OFF state of the oxide TFT, ions are accumulated in the TFT, and the on current (Ion) degradation phenomenon that the on current (Ion) is lowered occurs when the oxide TFT is turned on. On the other hand, the carry signal applied to the first transistor T1 is Vgout (N−2) in FIG. 5, but Vcout (n−4) in FIG. 13.

As the oxide TFT becomes a short channel, the on current of the transistor T1 is reduced due to the drain stress of the first transistor T1. When the on current of the transistor T1 is lowered, the pre-charging voltage of the Q node is lowered, the output voltage is lowered, and the high temperature reliability is lowered. In order to solve such a problem, the embodiment of the disclosure provides a first C transistor T1C and an asymmetrical capacitor Cb between the first transistor T1 and the VDD terminal so that a DC voltage is not directly applied to the drain of the transistor T1.

Figure 14:
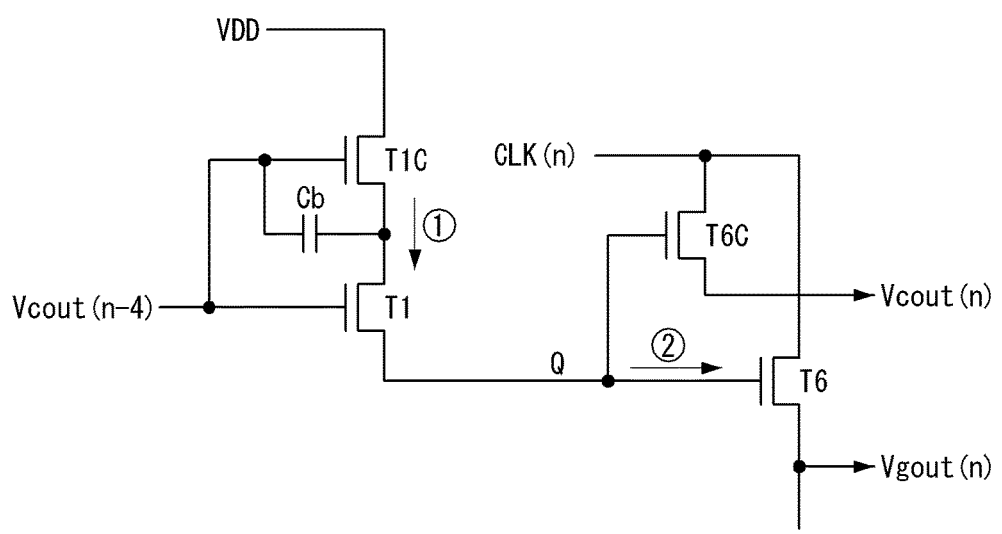
FIGS. 14, 15A and 15B are diagrams illustrating a Q node pre-charging voltage rising principle due to a circuit added in FIG. 13.
Figure 15A:
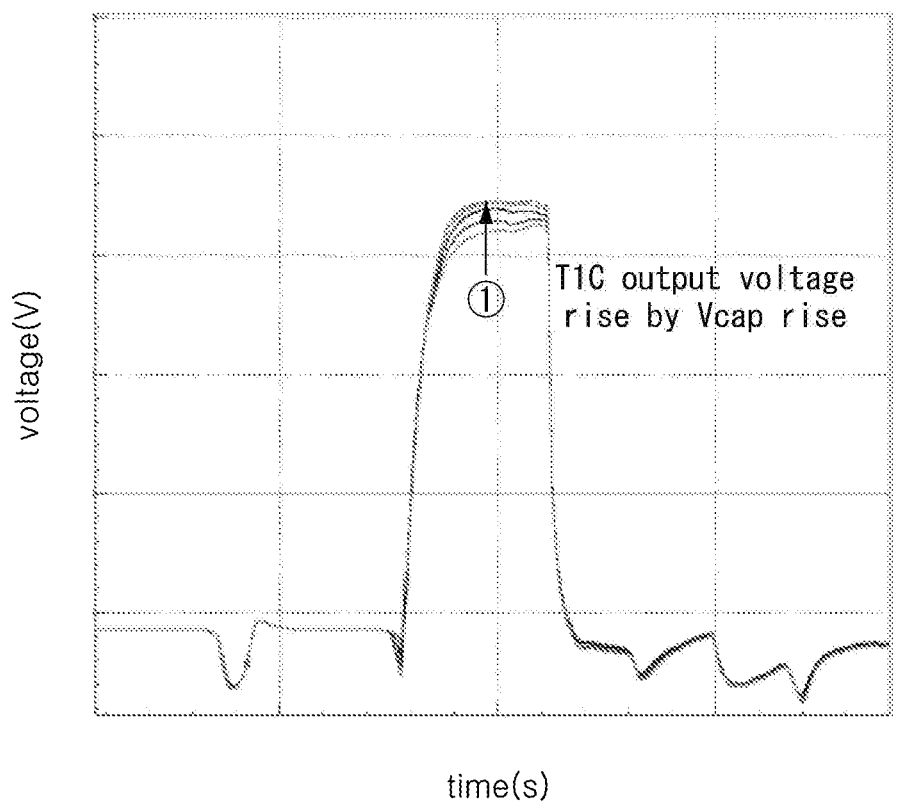
Figure 15B:
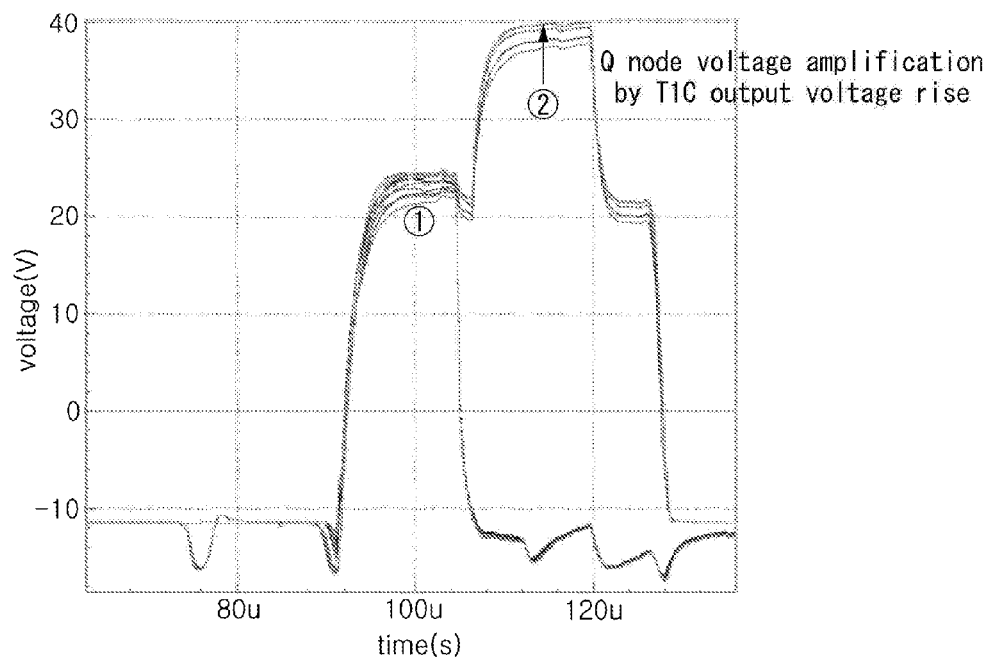

FIG. 13 is a circuit diagram illustrating a method for reducing stress of a Q node pre-charging transistor. FIGS. 14, 15A and 15B are diagrams illustrating a Q node pre-charging voltage rising principle due to a circuit added in FIG. 13. FIG. 15A is a simulation result illustrating a voltage rise of a node ① in FIG. 14. FIG. 15B is a simulated result illustrating a voltage rise of a node ② in FIG. 14.

Referring to FIGS. 13 and 14, a first transistor T1 includes a gate to which a carry signal Vcout (n−4) is applied, a first electrode connected to a node ①, and a second electrode connected to a Q node ②.

A first C transistor T1C includes a gate to which the carry signal Vcout (n−4) is applied, a first electrode connected to a VDD terminal, and a second electrode connected to the first electrode of the first transistor T1 through the node ①. An asymmetric capacitor Cb is connected between the gate and the second electrode of the first C transistor T1C.

The first C transistor T1C applies a gate-on voltage VGH to the first electrode of the first transistor T1 in response to the carry signal Vcout (n−4). Therefore, the first transistor T1 is disconnected from the VDD terminal in most of one frame period without the carry signal Vcout (n−4) and is not subjected to the stress due to the DC voltage of the VDD terminal.

The asymmetric capacitor Cb raises a voltage output from the first C transistor T1C as shown in FIG. 15A. When the carry signal Vcout (n−4) is input, the voltage of the node ① rises through the first C transistor T1C and the asymmetrical capacitor Cb, so that a pre-charging voltage of the Q node ② rises when the first transistor T1 is turned on in response to the carry signal Vcout (n−4), as shown in FIG. 15B. In FIG. 15A, "Vcap" is a voltage of the asymmetrical capacitor Cb. As a result of simulation, as the asymmetrical capacitor Cb connected to the first C transistor T1C is larger, a Q node voltage amplification effect becomes larger, so that power margin of the GIP circuit increases. The asymmetric capacitor Cb may be formed in the structure shown in FIG. 11a.

Figure 16:
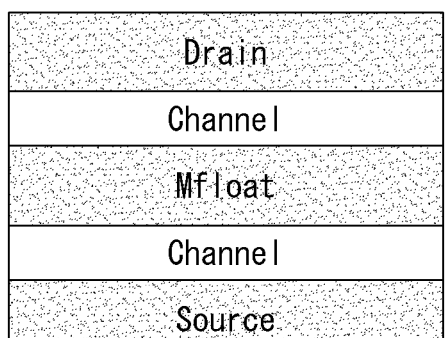
FIG. 16 is a plan view of a semiconductor channel illustrating a dual length structure and a single length structure of a transistor.
Figure 16:
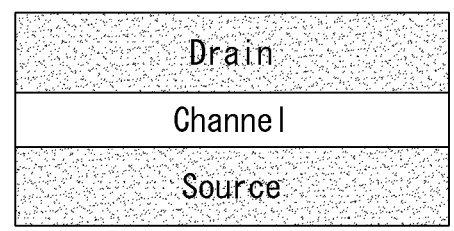

The transistor generally includes a semiconductor channel of a single length structure shown in FIG. 16. In such a transistor, when a length of the semiconductor channel is small, the on current (Ion) is lowered during the drain stress. When the length of the semiconductor channel of the transistor is lengthened, the on current (Ion) degradation phenomenon can be reduced. However, simply increasing the length of the semiconductor channel of the transistor may increase the rising and falling edge delay time of the gate pulse due to the increase of the S-factor of the transistor, which may lead to poor charge of the pixel.

Figure 17:
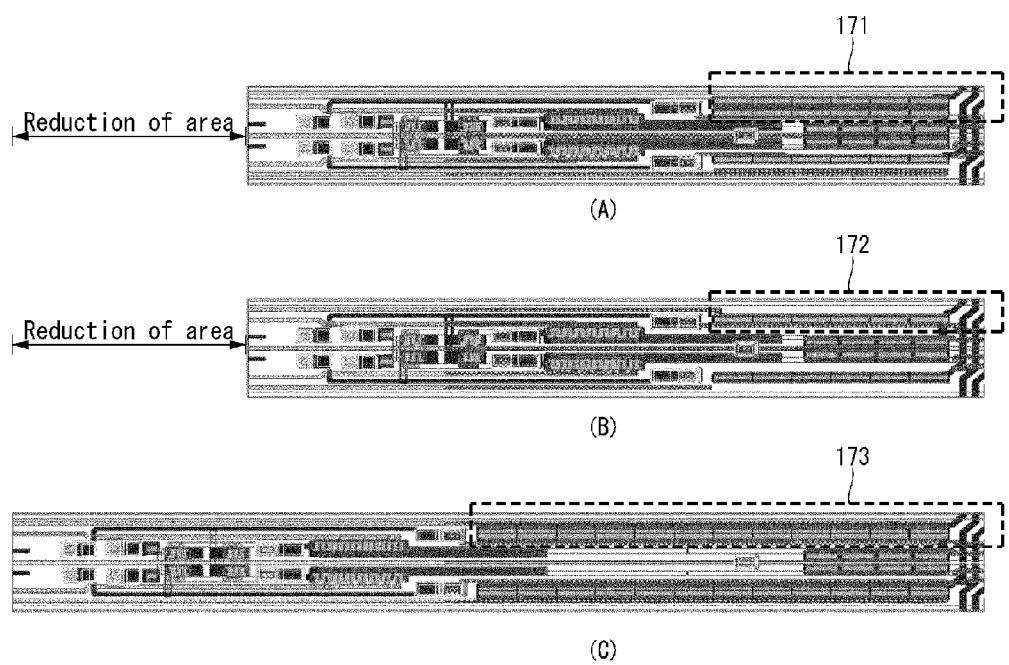
FIG. 17 is a plan view illustrating an area reducing effect of a GIP circuit when first and first C transistors of a single length structure are applied to the GIP circuit.

In order to reduce the on current (Ion) degradation phenomenon during the drain stress of the transistor, the transistor can be manufactured with a dual length structure as shown in FIG. 16. The dual length structure adds a floating dummy metal pattern (Mfloat) in the semiconductor channel to divide the semiconductor channel into two to double the length of the semiconductor channel. It is possible to mitigate the on current degradation phenomenon due to the drain stress without increasing the S-factor. However, this transistor of the dual length structure has a disadvantage in that a channel width of the semiconductor is doubled as shown in FIG. 17. In FIG. 17 (A), reference numeral 171 denotes a plan view illustrating first and first C transistors T1 and T1C having a single length structure. In FIG. 17 (B), reference numeral 172 denotes a plan view illustrating a first transistor T1 having a single length structure. In FIG. 17 (C), reference numeral 173 is a plan view illustrating a first transistor T1 having a dual length structure.

In the high resolution model above 4K, since a pixel pitch is very small, a transistor area of a GIP circuit becomes smaller in the vertical direction, but becomes larger in the horizontal direction, thereby resulting in an increase in a size of a bezel. When the dual length structure is applied, the GIP circuit area becomes larger as shown in FIG. 17.

The embodiment of the disclosure can minimize the drain stress of the first transistor T1 by connecting the first C transistor T1C to the first transistor T1. As a result, according to the embodiment of the disclosure, the first and first C transistors T1 and T1C are made of transistors of a single length structure, so that the output characteristics and reliability of the GIP circuit can be improved without increasing the size of the GIP circuit and the bezel.

As described above, the embodiment of the disclosure can remove the ripple or increase the Q node charging rate by connecting the asymmetric capacitors to at least one of the transistors constituting the GIP circuit. Therefore, the embodiments of the disclosure can improve operational characteristics and reliability of the GIP circuit. Further, the embodiments of the disclosure can implement a narrow bezel of a display device by reducing an area of a GIP circuit by implementing an asymmetric capacitor with a high capacitance capacitor disposed on an organic passivation layer covering a transistor.

The embodiments of the disclosure can reduce a drain stress of a transistor for charging a Q node by using an asymmetric capacitor, thereby reducing degradation of the transistor. Further, the embodiment of the disclosure can stably pre-charge the Q node by preventing the decrease of the on current of the transistor.

Although embodiments have been described with reference to an asymmetric capacitor, the disclosure and structure as taught and claimed herein can apply to any type of capacitor. Therefore, the claims are not limited to just an asymmetric capacitor unless such claim specifically contains such a limitation. A number of illustrative embodiments have been described, but it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A gate driver comprising:
 a plurality of stages to which a shift clock is applied through a clock wiring and which are connected in a cascade connection manner through a carry signal and sequentially generate an output voltage through each output terminal,
 each of the stages includes:
  a first transistor configured to pre-charge a Q node;
  a second transistor configured to raise the output voltage depending on a voltage of the Q node;
  a third transistor configured to charge a QB node;
  a fourth transistor configured to lower the output voltage depending on a voltage of the QB node; and
  a first capacitor connected between a gate and one of a source or a drain in at least one of the second transistor and the third transistor,
 wherein the first capacitor has a capacitance greater than a capacitance between the gate and the other one of the source or the drain of the transistor to which the first capacitor is connected, and
 wherein the first capacitor includes an upper capacitor disposed on an organic passivation layer overlaying the transistors.

2. The gate driver of claim 1, wherein the upper capacitor includes a first electrode and a second electrode opposite to each other with an inorganic passivation layer interposed therebetween.

3. The gate driver of claim 2, wherein the first capacitor further includes a lower capacitor disposed under the organic passivation layer and at least partially overlapped in projection with the upper capacitor, and
 wherein the lower capacitor includes a third electrode and a fourth electrode opposing each other with a gate insulating layer interposed therebetween.

4. The gate driver of claim 3, wherein a thickness of the inorganic passivation layer is less than that of the gate insulating layer.

5. The gate driver of claim 1, further comprising:
 a fifth transistor connected between a gate and a drain of the first transistor,
 wherein the fifth transistor includes:
  a gate connected to the gate of the first transistor;
  a drain to which a gate-on voltage is applied; and
  a source connected to the drain of the first transistor,
 wherein a carry signal is applied to the gates of the first and fifth transistors.

6. The gate driver of claim 5, further comprising:
 a second capacitor connected between the gate and the source of the fifth transistor,
 wherein the second capacitor has a capacitance greater than a capacitance between the gate and the drain of the fifth transistor, and
 wherein the second capacitor includes an upper capacitor disposed on the organic passivation layer.

7. The gate driver of claim 6, wherein the upper capacitor of the second capacitor includes a first electrode and a second electrode opposite to each other with an inorganic passivation layer interposed therebetween.

8. The gate driver of claim 7, wherein the second capacitor further includes a lower capacitor disposed under the organic passivation layer and at least partially overlapped in projection with the upper capacitor, and wherein the lower capacitor includes a third electrode and a fourth electrode at least partially overlapped with each other with a gate insulating layer interposed therebetween.

9. The gate driver of claim 6, wherein each of the first and fifth transistors has a semiconductor channel of a single length structure.

10. A display device comprising:
a display panel in which data lines and gate lines intersect, pixels are arranged in a matrix form; and
a display driver configured to write data of an input image to the pixels, the display driver including a shift register configured to sequentially supply a gate pulse to the gate lines, the shift register including:
  a plurality of stages to which a shift clock is applied through a clock wiring and which are connected in a cascade connection manner through a carry signal and sequentially generate an output voltage through each output terminal,
  wherein each of the stages includes:
    a first transistor configured to pre-charge a Q node;
    a second transistor configured to raise the output voltage depending on a voltage of the Q node;
    a third transistor configured to charge a QB node;
    a fourth transistor configured to lower the output voltage depending on a voltage of the QB node; and
    a first capacitor connected between a gate and one of a source or a drain in at least one of the second transistor and the third transistor,
  wherein the first capacitor has a capacitance greater than a capacitance between the gate and another one of the source or the drain of the transistor to which the first capacitor is connected, and
  wherein the first capacitor includes an upper capacitor disposed on an organic passivation layer overlaying the transistors.

11. The display device of claim 10, wherein the first capacitor further includes a lower capacitor disposed under the organic passivation layer and overlapped with the upper capacitor, and
wherein the lower capacitor includes a third electrode and a fourth electrode at least partially overlapped with each other with a gate insulating layer interposed therebetween.

12. The display device of claim 10, further comprising:
a fifth transistor connected between a gate and a drain of the first transistor,
wherein the fifth transistor includes:
  a gate connected to the gate of the first transistor;
  a drain to which a gate-on voltage is applied; and
  a source connected to the drain of the first transistor,
wherein a carry signal is applied to the gates of the first and fifth transistors.

13. The display device of claim 12, further comprising:
a second capacitor connected between the gate and the source of the fifth transistor,
wherein the second capacitor has a capacitance greater than a capacitance between the gate and the drain of the fifth transistor, and
wherein the second capacitor includes the upper capacitor disposed on the organic passivation layer.

14. The display device of claim 13, wherein the upper capacitor includes a first electrode and a second electrode opposite to each other with an inorganic passivation layer interposed therebetween.

15. The display device of claim 14, wherein the second capacitor further includes a lower capacitor disposed under the organic passivation layer and at least partially overlapped in projection with the upper capacitor, and
wherein the lower capacitor includes a third electrode and a fourth electrode at least partially overlapped with each other with a gate insulating layer interposed therebetween.

16. The display device of claim 15, wherein a thickness of the inorganic passivation layer is less than that of the gate insulating layer.

17. The display device of claim 13, wherein each of the first and fifth transistors has a semiconductor channel of a single length structure.

18. A structure comprising:
a first metal layer overlying a substrate;
an insulation layer overlying the first metal layer;
a first aperture in the insulation layer exposing the first metal layer;
a second metal layer overlying the insulation layer and the first metal layer to create a lower capacitive element;
a first passivation layer overlying the second metal layer,
a second aperture in the first passivation layer exposing the second metal layer;
a third metal layer overlying the first passivation layer, the first metal layer, the insulation layer and the second metal layer;
a second passivation layer overlying the third metal layer;
a third aperture in the second passivation layer exposing the third metal layer;
a fourth metal layer overlying the third metal layer and the second passivation layer to create an upper capacitive element;
a metal connection extending from the first aperture to the third aperture that electrically connects the first metal layer of the lower capacitive element to the third metal layer of the upper capacitive element; and
a metal connection extending from the second aperture to the fourth metal layer that electrically connects the second metal layer to the fourth metal layer of the upper capacitive element.

19. The structure of claim 18, wherein the upper capacitive element and the lower capacitive element at least partially overlap one another in plan projection.

20. The structure of claim 19, wherein the second passivation layer is greater than five times thicker than the insulation layer to reduce the capacitive coupling between the second and third metal layers relative to the capacitive coupling between the first and second metal layers.

* * * * *